(12) United States Patent
Furusho et al.

(10) Patent No.: US 11,094,835 B2
(45) Date of Patent: Aug. 17, 2021

(54) SILICON CARBIDE SUBSTRATE, METHOD FOR MANUFACTURING SILICON CARBIDE SUBSTRATE, AND METHOD FOR MANUFACTURING SILICON CARBIDE SEMICONDUCTOR DEVICE

(71) Applicants: Mitsubishi Electric Corporation, Tokyo (JP); NATIONAL UNIVERSITY CORPORATION NAGOYA UNIVERSITY, Aichi (JP)

(72) Inventors: Tomoaki Furusho, Tokyo (JP); Takanori Tanaka, Tokyo (JP); Takeharu Kuroiwa, Tokyo (JP); Toru Ujihara, Aichi (JP); Shunta Harada, Aichi (JP); Kenta Murayama, Aichi (JP)

(73) Assignees: MITSUBISHI ELECTRIC CORPORATION, Tokyo (JP); NATIONAL UNIVERSITY CORPORATION NAGOYA UNIVERSITY, Aichi (JP)

( * ) Notice: Subject to any disclaimer, the term of this patent is extended or adjusted under 35 U.S.C. 154(b) by 0 days.

(21) Appl. No.: 16/483,754

(22) PCT Filed: Feb. 20, 2018

(86) PCT No.: PCT/JP2018/005948
§ 371 (c)(1),
(2) Date: Aug. 6, 2019

(87) PCT Pub. No.: WO2018/180013
PCT Pub. Date: Oct. 4, 2018

(65) Prior Publication Data
US 2020/0013907 A1    Jan. 9, 2020

(30) Foreign Application Priority Data
Mar. 28, 2017  (JP) .............................. JP2017-062447

(51) Int. Cl.
*H01L 29/868* (2006.01)
*C23C 16/32* (2006.01)
(Continued)

(52) U.S. Cl.
CPC .......... *H01L 29/868* (2013.01); *C23C 16/325* (2013.01); *C30B 25/205* (2013.01);
(Continued)

(58) Field of Classification Search
CPC ............ H01L 21/02378; H01L 21/205; H01L 21/02576; H01L 21/02529;
(Continued)

(56) References Cited

U.S. PATENT DOCUMENTS 6,734,461 B1 * 5/2004 Shiomi ................... C30B 23/00
257/77
9,105,756 B2 * 8/2015 Ishibashi ................ B28D 5/045
(Continued)

FOREIGN PATENT DOCUMENTS

| CN | 1829830 A | 9/2006 |
| JP | 2015-54815 A | 3/2015 |
| JP | 2015-529016 A | 10/2015 |

OTHER PUBLICATIONS

International Search Report and Written Opinion dated Apr. 17, 2018 for PCT/JP2018/005948 filed on Feb. 20, 2018, 8 pages including English Translation of the International Search Report.
(Continued)

*Primary Examiner* — Kyoung Lee
*Assistant Examiner* — Christina A Sylvia
(74) *Attorney, Agent, or Firm* — Xsensus LLP

(57) ABSTRACT

It is an object of the present invention to provide a silicon carbide substrate having a low defect density that does not contaminate a process device and a silicon carbide semiconductor device including the silicon carbide substrate. A
(Continued)

silicon carbide substrate according to the present invention is a silicon carbide substrate including: a substrate inner portion; and a substrate outer portion surrounding the substrate inner portion, wherein non-dopant metal impurity concentration of the substrate inner portion is $1\times10^{16}$ cm$^{-3}$ or more, and a region of the substrate outer portion at least on a surface side thereof is a substrate surface region in which the non-dopant metal impurity concentration is less than $1\times10^{16}$ cm$^{-3}$.

10 Claims, 4 Drawing Sheets

(51) Int. Cl.
  *C30B 25/20* (2006.01)
  *C30B 29/36* (2006.01)
  *H01L 21/02* (2006.01)
  *H01L 21/205* (2006.01)
(52) U.S. Cl.
  CPC ........ *C30B 29/36* (2013.01); *H01L 21/02378* (2013.01); *H01L 21/205* (2013.01)
(58) Field of Classification Search
  CPC ......... H01L 21/02447; H01L 21/02581; H01L 29/0619; H01L 29/36; H01L 29/167; H01L 29/1608; H01L 29/8611; H01L 29/868; C23C 16/325; C30B 29/36; C30B 19/04; C30B 25/2052
  See application file for complete search history.

(56) References Cited

U.S. PATENT DOCUMENTS

| | | | |
|---|---|---|---|
| 2006/0234058 A1 | 10/2006 | Ohmi et al. | |
| 2009/0173997 A1* | 7/2009 | Fujihira | H01L 29/7802 257/335 |
| 2009/0283866 A1* | 11/2009 | Schulze | H01L 21/26513 257/607 |
| 2009/0302328 A1* | 12/2009 | Ohno | H01L 21/02433 257/77 |
| 2015/0132542 A1 | 5/2015 | Sun et al. | |

OTHER PUBLICATIONS

Office Action dated Nov. 3, 2020, in corresponding Chinese patent Application No. 201880019618.9, 17 pages.
Office Action dated Jun. 2, 2021, in corresponding Chinese patent Application No. 201880019618.9, 9 pages.

* cited by examiner

F I G. 7
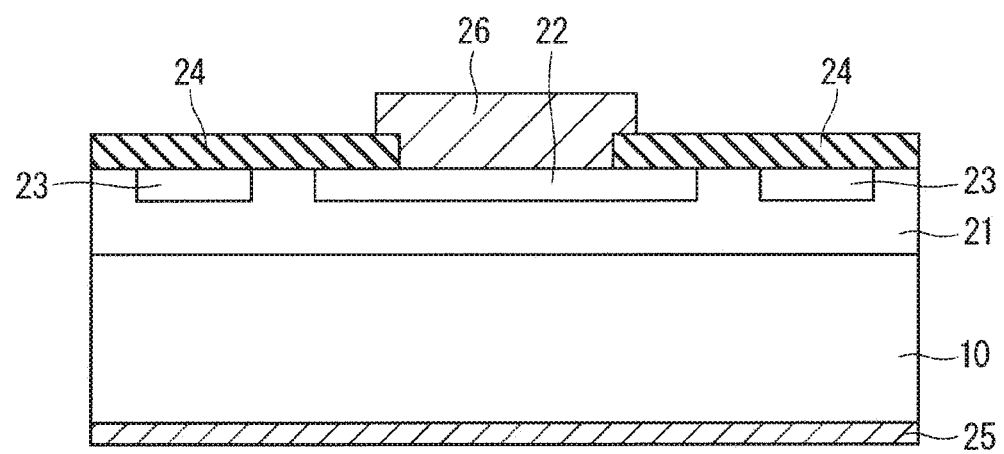

SILICON CARBIDE SUBSTRATE, METHOD FOR MANUFACTURING SILICON CARBIDE SUBSTRATE, AND METHOD FOR MANUFACTURING SILICON CARBIDE SEMICONDUCTOR DEVICE

CROSS-REFERENCE TO RELATED APPLICATIONS

The present application is based on PCT filing PCT/JP2018/005948, filed Feb. 20, 2018, which claims priority to JP 2017-062447, filed Mar. 28, 2017, the entire contents of each are incorporated herein by reference.

TECHNICAL FIELD

The present invention relates to a silicon carbide substrate and a silicon carbide semiconductor device.

BACKGROUND ART

Silicon carbide (SiC) has superior thermal and chemical properties, and is known as a semiconductor material having superior electrical properties as it has a larger band gap than silicon (Si). In particular, 4H-SiC has high electron mobility and high saturated electron velocity, and thus has already been put to practical use as a semiconductor material for a power device.

A modified Lely method (sublimation) is currently widely used as a method of manufacturing an SiC single crystal. As for the size of an SiC substrate, the diameter thereof is currently up to 150 mm when it is commercially available, and is 200 mm at the stage of development. However, there has been a problem in that the SiC substrate has a high crystal defect density of several thousands to 10,000 cm$^2$, and it is necessary to further decrease the crystal defect density to use it for a semiconductor device.

As a method of manufacturing an SiC single crystal having a low defect density, a method of performing crystal growth from liquid as in single crystal growth of an Si ingot is considered. Specifically, SiC is grown by dissolving carbon (C) in Si melt to crystallize SiC on a seed crystal of SiC. This method enables crystal growth with a supersaturation degree lower than that in sublimation as the crystal growth is performed from liquid, and is thus known as a method of manufacturing the SiC single crystal having a low defect density. In this method, however, an industrially-sufficient solubility of C, that is, growth rate of the SiC single crystal, can be obtained only under ultra-high temperature and a ultra-high pressure of approximately 100 atmospheres as the solubility of C in the Si melt is low, and thus this method is impractical.

It has been revealed that use of metal such as chromium (Cr) and iron (Fe) dissolved, as a solute, in an Si solvent significantly improves the solubility of C in Si. As a result, a practical growth rate can be obtained even under ambient pressure at the growth near atmospheric pressure, and there have been numerous reports of a method of manufacturing, at a practical growth rate, the SiC single crystal having a low defect density whose threading dislocation density has been reduced to 10 cm$^{-2}$ or less that is approximately one tenth to one hundredth of that of a conventional substrate manufactured by sublimation, as in Patent Document 1. At present, a solution growth method for SiC usually refers to this method.

PRIOR ART DOCUMENT

Patent Document

Patent Document 1: Japanese Patent Application Laid-Open No. 2015-54815

SUMMARY

Problem to be Solved by the Invention

In the solution growth method, metal solutes such as Cr added to an Si solvent to improve the solubility of C in Si are introduced into a grown SiC single crystal as metal impurities that are not dopants (hereinafter, referred to as "non-dopant metal impurities"). When a semiconductor device is manufactured using a substrate of the SiC single crystal containing the non-dopant metal impurities, the non-dopant metal impurities are discharged into a process device by etching, sublimation, or contact with a jig of the substrate during the process. As a result, the inside of the process device is contaminated by the non-dopant metal impurities, and degradation of device properties is induced.

The present invention has been conceived to solve the above-mentioned problem, and it is an object of the present invention to provide a silicon carbide substrate having a low defect density that does not contaminate a process device and a silicon carbide semiconductor device including the silicon carbide substrate.

Means to Solve the Problem

A silicon carbide substrate according to the present invention is a silicon carbide substrate including: a substrate inner portion; and a substrate outer portion surrounding the substrate inner portion, wherein non-dopant metal impurity concentration of the substrate inner portion is $1\times10^{16}$ cm$^{-3}$ or more, and a region of the substrate outer portion at least on a surface side thereof is a substrate surface region in which the non-dopant metal impurity concentration is less than $1\times10^{16}$ cm$^{-3}$.

Effects of the Invention

The silicon carbide substrate according to the present invention is a silicon carbide substrate including: a substrate inner portion; and a substrate outer portion surrounding the substrate inner portion, wherein non-dopant metal impurity concentration of the substrate inner portion is $1\times10^{16}$ cm$^{-3}$ or more, and a region of the substrate outer portion at least on a surface side thereof is a substrate surface region in which the non-dopant metal impurity concentration is less than $1\times10^{16}$ cm$^{-3}$. By reducing the non-dopant metal impurity concentration in the substrate surface region as described above, contamination of the process device of the device can be suppressed while reducing threading screw dislocation density of the silicon carbide substrate. The objects, features, aspects, and advantages of the present invention will become more apparent from the following detailed description and the accompanying drawings.

BRIEF DESCRIPTION OF DRAWINGS

FIG. 7 is a sectional view of a silicon carbide semiconductor device manufactured using the silicon carbide substrate according to Embodiment 1 of the present invention.

DESCRIPTION OF EMBODIMENTS

A. Embodiment 1

<A-1. Silicon Carbide Substrate>

Figure 1:
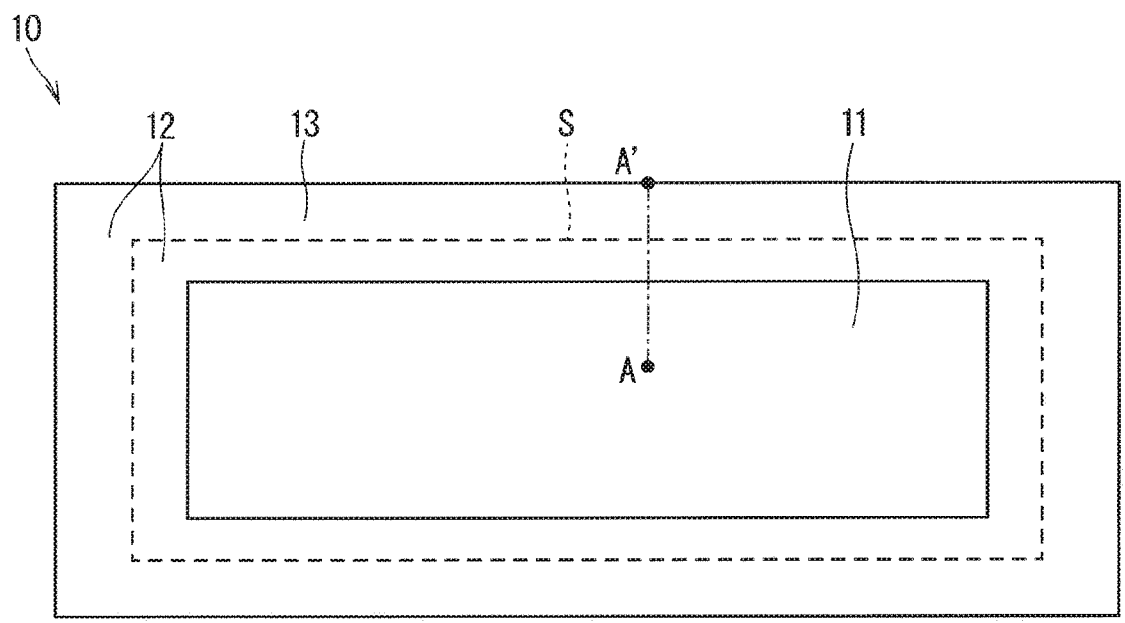
FIG. 1 is a sectional view of a silicon carbide substrate according to Embodiment 1 of the present invention.

FIG. 1 is a sectional view of a silicon carbide substrate 10 according to Embodiment 1 of the present invention. The silicon carbide substrate 10 includes a substrate inner portion 11 and a substrate outer portion 12 covering the substrate inner portion 11 as a whole.

The substrate inner portion 11 is a single crystal substrate manufactured by a solution growth method using an Si solution to which Cr, which is non-dopant metal, has been added. The substrate outer portion 12 is a single crystal substrate covering the substrate inner portion 11 as a whole. An upper face of the silicon carbide substrate 10 is an Si face (0001) that is off in a [11-20] direction, for example.

The substrate inner portion 11 and the substrate outer portion 12 are each formed of 4H-type silicon carbide, but have different non-dopant metal impurity concentrations. The non-dopant metal impurity concentration of the silicon carbide substrate 10 changes in a direction from the center toward the surface of the silicon carbide substrate 10. In the present description, the surface of the silicon carbide substrate 10 includes the upper face, a lower face, and side faces of the silicon carbide substrate 10, and is also simply referred to as a "substrate surface". For example, a direction from the center toward the upper face of the silicon carbide substrate 10 is an A-A' direction of FIG. 1. The non-dopant metal impurity concentration is higher at the center of the silicon carbide substrate 10 than at the surface of the silicon carbide substrate 10.

The silicon carbide substrate 10 has, on a side of the surface thereof, a substrate surface region 13 in which the non-dopant metal impurity concentration is less than $1 \times 10^{16}$ cm$^{-3}$. The edge of the substrate surface region 13 opposite the substrate surface is herein defined as a starting point S of the substrate surface region 13 (hereinafter, simply referred to as a "starting point S"). That is to say, the starting point S is a point at which the non-dopant metal impurity concentration turns from $1 \times 10^{16}$ cm$^{-3}$ or more to less than $1 \times 10^{16}$ cm$^{-3}$ when the silicon carbide substrate 10 is traced from the center to the surface thereof. The starting point S is in the substrate outer portion 12 or at the boundary between the substrate outer portion 12 and the substrate inner portion 11. That is to say, a region of the substrate outer portion 12 at least on the surface side is the substrate surface region 13.

Figure 2:
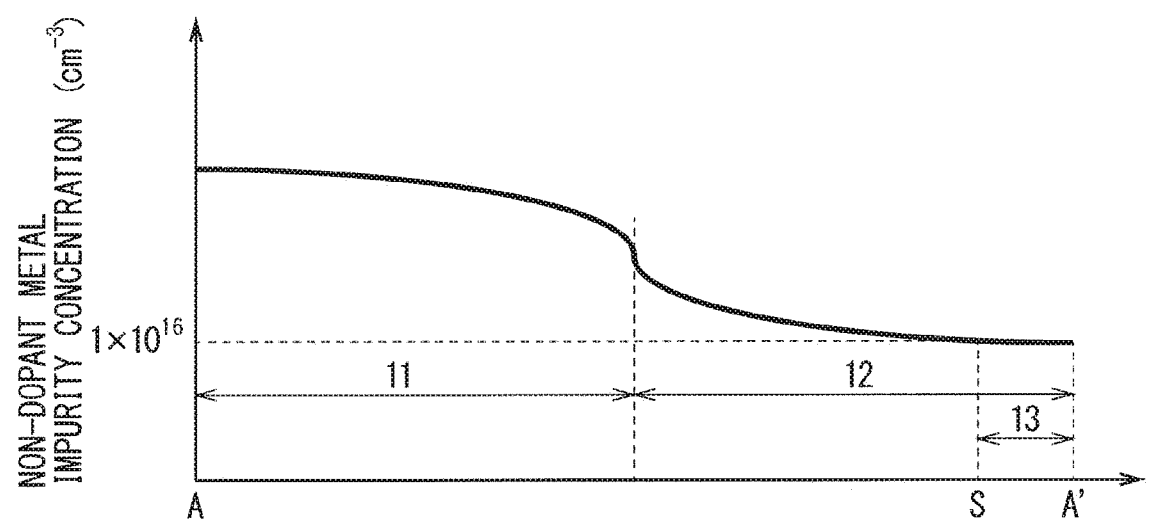
FIG. 2 shows non-dopant metal impurity concentration of the silicon carbide substrate according to Embodiment 1 of the present invention.
Figure 3:
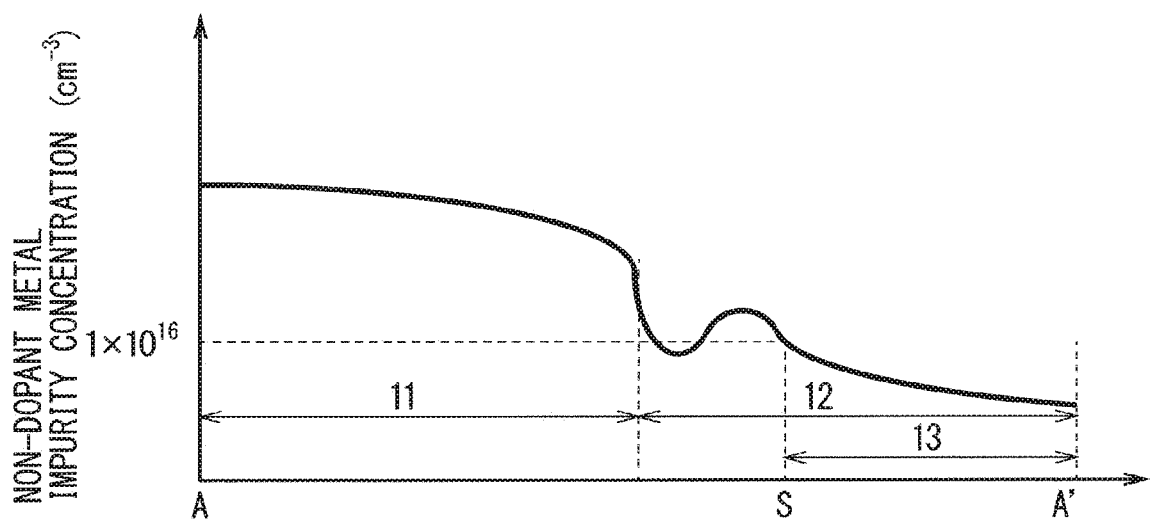
FIG. 3 shows the non-dopant metal impurity concentration of the silicon carbide substrate according to Embodiment 1 of the present invention.

FIG. 2 shows the non-dopant metal impurity concentration in cross section along the A-A' direction of FIG. 1. In FIG. 2, a curve of the non-dopant metal impurity concentration has an inflection point at the boundary between the substrate inner portion 11 and the substrate outer portion 12. The number of inflection points of the curve of the non-dopant metal impurity concentration may be one as shown in FIG. 2, and may be two or more as shown in FIG. 3. As shown in FIG. 3, in a case where the non-dopant metal impurity concentration repeatedly falls below $1 \times 10^{16}$ cm$^{-3}$ from $1 \times 10^{16}$ cm$^{-3}$ or more when the silicon carbide substrate 10 is traced from the center to the surface thereof, a region closest to the substrate surface from among a plurality of regions of the substrate outer portion 12 in which the non-dopant metal impurity concentration is less than $1 \times 10^{16}$ cm$^{-3}$ is defined as the substrate surface region 13.

Figure 4:
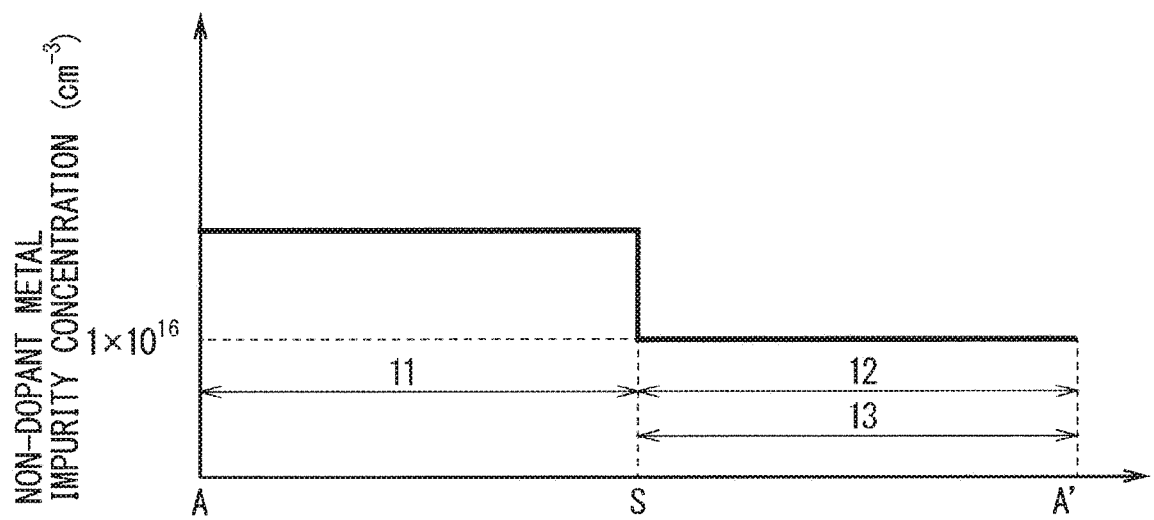
FIG. 4 shows the non-dopant metal impurity concentration of the silicon carbide substrate according to Embodiment 1 of the present invention.

FIG. 4 shows the curve of the non-dopant metal impurity concentration in a case where the starting point S is at the boundary between the substrate outer portion 12 and the substrate inner portion 11. In FIG. 4, the non-dopant metal impurity concentration changes abruptly at the starting point S, and the starting point S becomes a singular point of the concentration curve. The number of singular points of the curve of the non-dopant metal impurity concentration may be one as shown in FIG. 4, and may be two or more.

The non-dopant metal impurity concentration of each of the substrate inner portion 11, the substrate outer portion 12, and the substrate surface region 13 may be uniform as shown in FIG. 4, or may not be uniform as shown in FIG. 2 or FIG. 3.

As described above, the non-dopant metal impurity concentration in the substrate surface region 13 is set to be less than $1 \times 10^{16}$ cm$^{-3}$, but is more preferably set to be less than $5 \times 10^{15}$ cm$^{-3}$. One reason for reducing the non-dopant metal impurity concentration in the substrate surface region 13 is that contamination of the process device of the device is suppressed to thereby suppress degradation of device properties caused by the non-dopant metal impurities. To obtain an oxide film having high insulation reliability, for example, it is necessary to mix as few impurities, such as metal, as possible into the oxide film. Furthermore, mixture of any unexpected elements at formation of an electrode of the device can degrade the electrode due to alloying and the like. It is thus necessary to suppress contamination of the process device of the device.

Another reason for reducing the non-dopant metal impurity concentration in the substrate surface region 13 is that threading screw dislocation density of the silicon carbide substrate 10 is reduced. In a case where the non-dopant metal impurity is Cr, Cr substitutes for an Si atom in an SiC crystal, but has a larger atomic radius than Si. If Cr is mixed into the SiC crystal excessively, a change in lattice constant induces distortion inside the crystal, making crystal growth with a low threading screw dislocation density difficult. Threading screw dislocation can induce a leak current at application of a reverse voltage. If the non-dopant metal impurities are locally present at a high density, the induced distortion is concentrated, and not only an increase in threading screw dislocation density but also cracking and breakage in the crystal can be caused. For this reason, the non-dopant metal impurity density preferably has distribution.

The threading screw dislocation density is evaluated by an average value (hereinafter, referred to as "average threading screw dislocation density") in a region occupying an area of 2.0% or more of a sample as a whole. The threading screw dislocation density in a local region of 1 mm×1 mm, for example, is measured first, and the average threading screw dislocation density is obtained, through calculation, from the measured value as obtained. Various methods such as X-ray topography and molten KOH etching can be used to measure the threading screw dislocation density in the local region.

The average threading screw dislocation density in the substrate surface region 13 is at least 100 cm$^{-2}$ or less, is preferably 20 cm$^{-2}$ or less, is more preferably 10 cm$^{-2}$ or less, and most preferably 5 cm$^{-2}$ or less. A lower average threading screw dislocation density suppresses degradation of the device properties caused by the threading screw dislocation more, and enables manufacture of a less degraded large-area device.

The local threading screw dislocation density of the silicon carbide substrate 10 measured first in evaluation of the average threading screw dislocation density may not be uniform and may have distribution in each of the substrate surface region 13, the substrate outer portion 12, and the substrate inner portion 11 in connection with distribution of the non-dopant metal impurities. The average threading screw dislocation density may differ among the substrate inner portion 11, the substrate outer portion 12 and the substrate surface region 13. The threading screw dislocation increases its density with increasing non-dopant metal impurity dens and can increase its density depending on temperature distribution at the crystal growth, a surface state of the seed crystal, and the like.

The starting point S of the substrate surface region 13 is in the substrate outer portion 12 or at the boundary between the substrate outer portion 12 and the substrate inner portion 11. The distance between the starting point S and the substrate surface is herein not necessarily to be uniform across the silicon carbide substrate 10 as a whole. That is to say, the distances of the upper face, the lower face, and the side faces of the silicon carbide substrate 10 from the starting point S may be different, and the distance from the starting point S on one surface of the silicon carbide substrate 10 may vary depending on an in-plane location. That is to say, the non-dopant metal impurity concentration may have distribution in a thickness direction of the substrate inner portion 11 or a direction perpendicular to the thickness direction, and, similarly, may have distribution in a thickness direction of the substrate outer portion 12 or the substrate surface region 13 or a direction perpendicular to the thickness direction. From the viewpoint of using the silicon carbide substrate 10 as a substrate for manufacturing a semiconductor device, however, a minimum value and a maximum value attributable to the following device process are determined as for the distance between the starting point S and the substrate surface.

Conditions that the distance between the starting point S and the substrate surface should meet will be described next.

Figure 5:
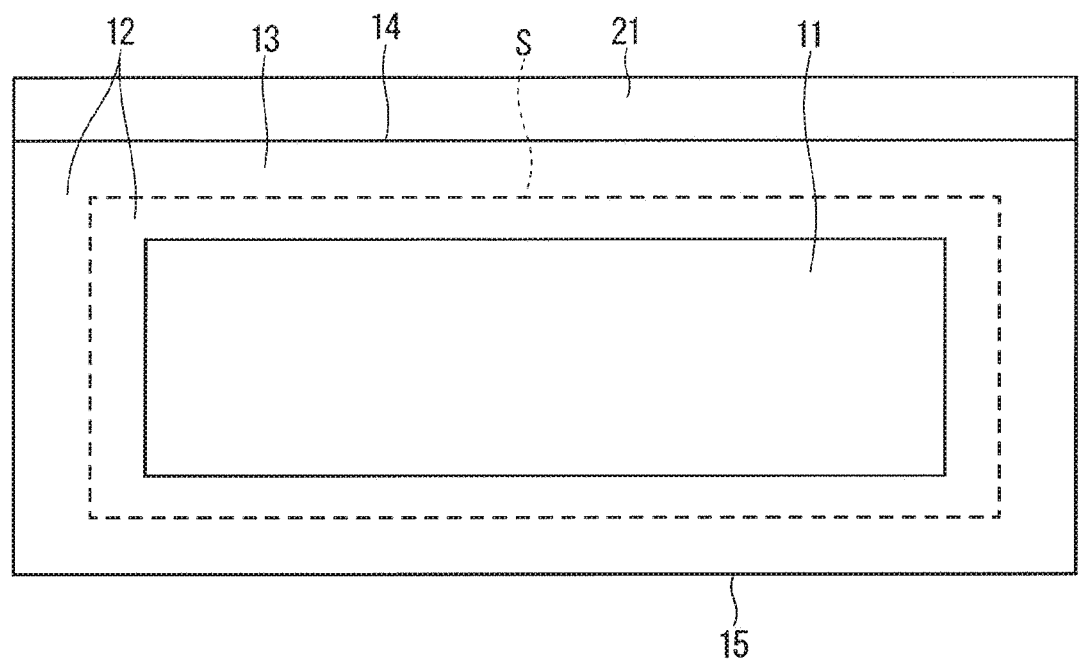
FIG. 5 is a sectional view illustrating the state of a drift layer being formed on the silicon carbide substrate according to Embodiment 1 of the present invention.

FIG. 5 is a sectional view illustrating the state of a drift layer 21 being formed on an upper face 14 of the silicon carbide substrate 10. In the process of manufacturing the semiconductor device, after hydrogen (H2) etching of the upper face 14, which is a first main surface of the silicon carbide substrate 10, the drift layer 21 is typically epitaxially grown on the upper face 14 of the silicon carbide substrate 10 by chemical vapor deposition (CVD). The etching before the epitaxial growth purifies the upper face 14 of the silicon carbide substrate 10, allows for formation of an atomic step on the upper face 14 of the silicon carbide substrate 10, and thus can improve the quality of an epitaxial film. The upper face 14 is mainly etched, but a lower face 15 and side faces 16 are etched at the same time by wraparound of hydrogen and the like. The distance between the starting point S and the substrate surface is herein set to be equal to or greater than twice the thickness of a portion of the silicon carbide substrate 10 removed by etching before the epitaxial growth of the drift layer 21. This is determined to be Condition (1). In a case where Condition (1) is not met, the substrate surface region 13 might disappear due to etching before the epitaxial growth to expose the substrate inner portion 11, and, in this case, the effect of the present invention cannot be obtained.

There is no condition that the maximum value of the distance between the surface of the silicon carbide substrate 10 and the starting point S should meet from the viewpoint of the quality of the device. However, the thickness of the substrate outer portion 12 is preferably set to be as small as possible from the viewpoint of the time and cost to form the substrate outer portion 12. The distance between the starting point S and the substrate surface is thus set to be equal to or smaller than 300 times the thickness of the portion of the silicon carbide substrate 10 removed by etching before epitaxial growth of the drift layer 21. This is determined to be Condition (2).

In the process of manufacturing the semiconductor device, an oxide film, such as a thermal oxide film, is formed over the drift layer 21. An oxidation rate of SiC varies depending on surface orientation, and thus, if the thickness of the substrate surface region 13 is small relative to the oxide film, the substrate surface region 13 as a whole might be oxidized at any of the faces of the silicon carbide substrate 10 at the formation of the oxide film of the device. In this case, the substrate inner portion 11 is exposed by etching the oxide film using hydrogen fluoride (HF) and the like, and the effect of the present invention cannot be obtained. Thus, the distance between the starting point S and the substrate surface is set to be equal to or greater than 20 times the thickness of the thermal oxide filth of the device to be manufactured in a case where the upper face 14 of the silicon carbide substrate 10 is an Si face (0001), and is set to be equal to or greater than five times the thickness of the thermal oxide film of the device to be manufactured in a case where the upper face 14 of the silicon carbide substrate 10 is a C face (000-1). This is determined to be Condition (3).

In FIG. 5, a second main surface of the silicon carbide substrate 10 opposite the upper face 14, which is the first main surface, is defined as the lower face 15. In a case where the lower face 15 of the silicon carbide substrate 10 is machined during the device process, the substrate surface region 13 might disappear during machining of the lower face 15 if the distance between the starting point S and the lower face 15 is smaller than 20 μm. On the other hand, considering the accuracy of machining of a typical machining apparatus for a semiconductor substrate, an increase in distance between the starting point S and the lower face 15 to greater than 300 μm is useless, and only increases the loss attributable to the time or the cost of manufacture. The distance between the starting point S and the lower face 15 is thus set to be between 20 μm and 300 μm inclusive. This is determined to be Condition (4).

In summary, conditions that the distance between the starting point S of the substrate surface region 13 and the surface of the silicon carbide substrate 10 should meet are basically Conditions (1) to (3), and Condition (4) is added in a case where the lower face 15 is machined during the device process. The distances of the upper face 14, the lower face 15, and the side faces 16 of the silicon carbide substrate 10 from the starting point S of the substrate surface region 13 may not be identical.

In a case where the minimum value of the distance between the surface of the silicon carbide substrate 10 and the starting point S of the substrate surface region 13 differs among Conditions (1), (3), and (4), the largest value from among the minimum values specified by these conditions is used. In a case where the maximum value of the distance between the surface of the silicon carbide substrate 10 and the starting point S of the substrate surface region 13 differs between Conditions (2) and (4), the largest value from among the maximum values specified by these conditions is used.

A device manufacture region of each of the substrate inner portion 11, the substrate outer portion 12, and the substrate surface region 13 is a single crystal. A region other than the device manufacture region of each of the substrate inner portion 11, the substrate outer portion 12, and the substrate surface region 13 is not required to be a single crystal.

The substrate inner portion 11 and the substrate outer portion 12 may differ in dopant concentration or lattice constant. The dopant concentration of the substrate inner portion 11 and the substrate outer portion 12, however, is adjusted so that the substrate inner portion 11 and the substrate outer portion 12 each have a volume resistivity of 25 m $\Omega$cm or less, preferably 20 m $\Omega$cm or less, and more preferably 16 m $\Omega$cm or less. This enables suppression of resistance at the manufacture of a vertical electronic device, and thus enables manufacture of a low-loss device. As a dopant, nitrogen can be used for N-type, and Al can be used for P-type.

<A-2. Method of Manufacturing Silicon Carbide Substrate>

A first method of manufacturing the silicon carbide substrate 10 will be described using FIG. 1.

First, the substrate inner portion 11 is manufactured by the solution growth method. Specifically, a seed crystal of 4H-SiC is put into the Si solution to which Cr, which is the non-dopant metal, has been added, and the temperature of the seed crystal is kept at 1820° C. The crystal growth is performed from the Si face of the seed crystal, and a 4H-SiC single crystal having a thickness of 0.7 mm can be obtained in six hours. The average threading screw dislocation density of a portion grown by the solution growth method as evaluated by the X-ray topography is herein 3 cm$^{-2}$. Cr concentration at the surface of the crystal as detected by inductively coupled plasma mass spectrometry (ICP-MS) is $3.3 \times 10^{15}$ cm$^{-2}$. Furthermore, Cr volume concentration in a region from the surface to the depth of 3 μm of the crystal as measured by secondary ion mass spectrometry (SIMS) is $1.1 \times 10^{16}$ cm$^{-3}$.

The seed crystal is removed from the 4H-SiC single crystal by machining, such as grinding, so that only the portion grown by the solution growth method remains. A free-standing single crystal substrate thus obtained is the substrate inner portion 11.

Next, the substrate outer portion 12 is epitaxially grown on the substrate inner portion 11 by the CVD. Specifically, the substrate outer portion 12 is epitaxially grown on the C face and the side faces of the substrate inner portion 11 by first epitaxial growth, and the substrate outer portion 12 is epitaxially grown on the Si face and the side faces of the substrate inner portion 11 by second epitaxial growth. The silicon carbide substrate 10 is thus obtained. The thickness of the substrate outer portion 12 is 20 μm at each of the C face and the Si face of the silicon carbide substrate 10, and is approximately 30 μm at the side faces of the silicon carbide substrate 10. The C face and the Si face each have undergone CMP before the epitaxial growth.

The Cr concentration at the surface of the substrate outer portion 12 as evaluated by the ICP-MS is $7.5 \times 10^{12}$ cm$^{-2}$. The Cr concentration in a region from the surface to the depth of 3 μm of the substrate outer portion 12 as analyzed by the SIMS is $7.4 \times 10^{13}$ cm$^{-3}$, which is sufficiently low concentration. Furthermore, the Cr concentration of the substrate outer portion 12 as a whole is less than $1 \times 10^{16}$ cm$^{-3}$, and it has been confirmed that the substrate outer portion 12 as a whole is the substrate surface region 13. The average threading screw dislocation density in the substrate surface region 13 as evaluated by the X-ray topography is 3 cm$^{-2}$ as in the substrate inner portion 11.

The substrate outer portion 12 is formed by the epitaxial growth performed twice by the CVD in the present embodiment, but the number of times the growth is performed may be selected as appropriate depending on a growth condition and a device structure. For example, according to a structure in which the drift layer 21 doubles as a portion of the substrate outer portion 12 on a side of the upper face 14, the number of times the epitaxial growth is performed to manufacture the device can be reduced.

A second method of manufacturing the silicon carbide substrate 10 will be described next.

First, the substrate inner portion 11 is manufactured by the same method as in the first manufacturing method. The average threading screw dislocation density of the portion grown by the solution growth method as evaluated by the X-ray topography is 20 cm$^{-2}$, which is higher than that of the substrate inner portion 11 manufactured by the first manufacturing method. The difference is considered to be due to a variation in temperature distribution at the crystal growth, the surface state of the seed crystal, or the defect density of the substrate inner portion 11. The Cr concentration at the surface of the substrate inner portion 11 as detected by the ICP-MS is $3.5 \times 10^{15}$ cm$^{-2}$. The Cr volume concentration in a region from the surface to the depth of 3 μm of the substrate inner portion 11 as evaluated by the SIMS is $1.2 \times 10^{16}$ cm$^{-3}$.

Figure 6:
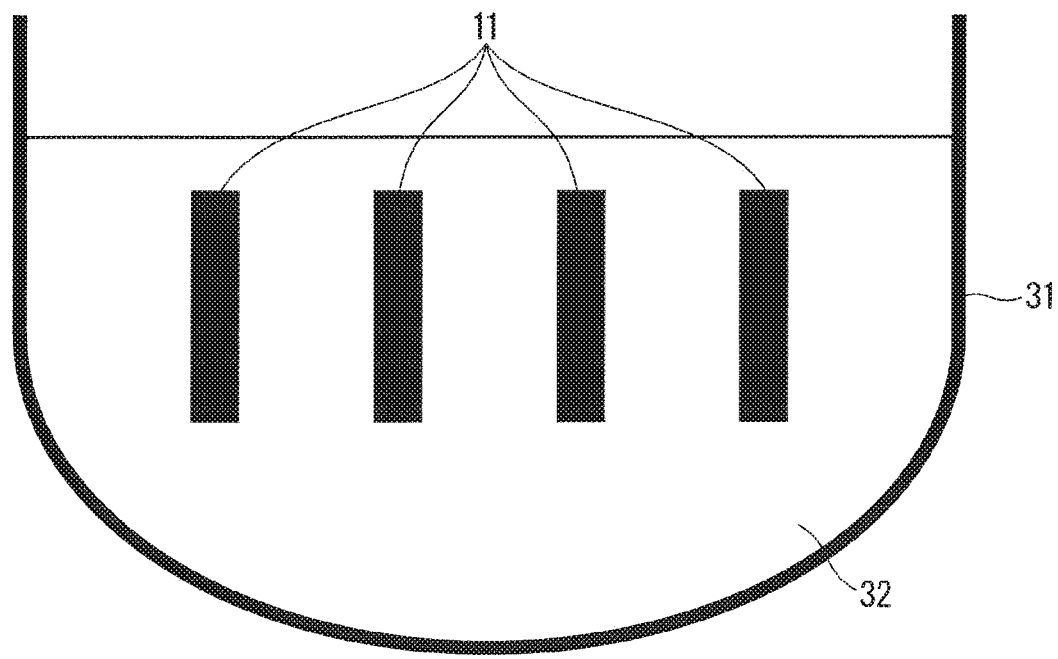
FIG. 6 illustrates a method of manufacturing the silicon carbide substrate according to Embodiment 1 of the present invention.

Next e substrate outer portion 12 is manufactured by the solution growth method. Specifically, a plurality of substrate inner portions 11 are put into a graphite crucible 31 filled with a pure Si solvent 32, as illustrated in FIG. 6. The non-dopant metal, such as Cr and Fe, has not been added to the pure Si solvent 32. Each of the substrate inner portions 11 used as the seed crystals are then heated to 1820° C., and undergoes the crystal growth for two hours, so that the substrate outer portion 12 having a thickness of approximately 20 μm is formed all around the substrate inner portion 11.

The Cr concentration at the surface of the substrate outer portion 12 as evaluated by the ICP-MS is $8.0 \times 10^{12}$ cm$^{-2}$. The Cr volume concentration in the region from the surface to the depth of 3 μm of the substrate outer portion 12 as evaluated by the SIMS is $7.6 \times 10^{13}$ cm$^{-3}$, and it has been confirmed that the Cr volume concentration is sufficiently low concentration. Furthermore, the Cr concentration of the substrate outer portion 12 as a whole is less than $1 \times 10^{16}$ cm$^{-3}$, and it has been confirmed that the substrate outer portion 12 as a whole is the substrate surface region 13. The average threading screw dislocation density in the substrate surface region 13 as evaluated by the X-ray topography is 1 cm$^{-2}$.

In the above-mentioned description, the substrate inner portion 11 is heated to 1820° C., but any conditions relating to the growth, such as the temperature and a detailed structure of the crucible, can be modified as appropriate.

The method of manufacturing the substrate outer portion 12 by the CVD or the solution growth method has been described above, but the method of manufacturing the substrate outer portion 12 is not limited to these methods. For example, the substrate outer portion 12 can be manufactured by another method, such as close-spaced sublimation.

<A-3. Silicon Carbide Semiconductor Device>

FIG. 7 is a sectional view of one cell of a PN diode that is a silicon carbide semiconductor device manufactured using the silicon carbide substrate 10 manufactured by the first manufacturing method. Device properties of the PN diode in FIG. 7 are evaluated.

The substrate inner portion 11 has been manufactured by the solution growth method, is the 4H-SiC single crystal having the Si face (0001) that is 4° off in the direction, and has a Cr concentration of $1.3\times10^{16}$ cm$^{-3}$, a threading screw dislocation density of 2.5 cm−2, and a thickness of 300 μm.

The substrate outer portion 12 is epitaxially grown around the substrate inner portion 11 by the CVD performed twice. Specifically, after the C face of the substrate inner portion 11 undergoes the CMP, the epitaxial growth is performed on the C face by the CVD to grow an epitaxial film having a thickness of 45 μm and a concentration of nitrogen as the dopant of $5.0\times10^{18}$ cm$^{-3}$. Then, the Si face of the substrate inner portion 11 undergoes the CMP, and the epitaxial growth is performed on the Si face by the CVD to grow an epitaxial film having a thickness of 15 μm and a concentration of nitrogen as the dopant of $3.8\times10^{18}$ cm$^{-3}$.

The Cr concentration in the region from the surface to the depth of 3 μm of the substrate outer portion 12 as analyzed by the SIMS is $8.0\times10^{13}$ cm$^{-3}$, and the average threading screw dislocation density at the Si face of the substrate outer portion 12 as evaluated by the X-ray topography is 2.5 cm$^{-2}$ as in the substrate inner portion 11. The silicon carbide substrate 10 has a thickness of approximately 360 μm, and the substrate outer portion 12 has a thickness at an end face of approximately 20 μm.

Next, the Si face of the silicon carbide substrate 10 manufactured by the above-mentioned process is removed by approximately 50 nm by the H2 etching, and then an n-type drift layer 21 having a thickness of 11 μm and a nitrogen concentration of $1.0\times10^{16}$ cm$^{-3}$ is formed on the Si face. The concentration of nitrogen, which is the dopant, or a film thickness of the drift layer 21 may be selected as appropriate according to a designed breakdown voltage of the device to be manufactured.

P-type impurities are then ion implanted into an upper face of the drift layer 21 to form an anode layer and a terminal region 23. Implanted ions are Al, for example, and an implantation depth is approximately 0.1 μm to 3.0 μm. The impurity concentration of Al as ion implanted is $1\times10^{18}$ cm$^{-3}$ to $1\times10^{21}$ cm$^{-3}$, and is set to be higher than n-type impurity concentration of the drift layer 21. The anode layer 22 may be formed by epitaxially growing a p-type SiC layer on the drift layer 21.

Next, heat treatment is performed in an inert gas atmosphere at 1300° C. to 2000° C. for ten seconds to one hour to activate the anode layer 22 and the terminal region 23 formed by the ion implantation.

A protective film 24 made of silicon oxide is then formed by thermal oxidation and the CVD. Herein, the thickness of the protective film 24 formed by the thermal oxidation is 10 nm and the thickness of the protective film 24 formed by the CVD is 90 nm, and the total thickness is 100 nm. Next, photolithography is performed to provide an opening over the anode layer 22 by reactive ion etching (RIE) or etching using hydrogen fluoride (HF). In this case, a thermal oxide film having a thickness of approximately 50 nm has been formed on the C face of the silicon carbide substrate 10, which is opposite the face on which the protective film 24 has been formed, and a thermal oxide film having a thickness of approximately 45 nm has been formed on the side faces of the silicon carbide substrate 10. These thermal oxide films are sufficiently thinner than the substrate outer portion 12 so that, if the thermal oxide films are removed, the substrate outer portion 12 is not completely removed to expose the substrate inner portion Next, a cathode electrode 25 to be in ohmic contact with the silicon carbide substrate 10 is formed by sputtering acid the like on the C face of the silicon carbide substrate 10, which is opposite the face on which the anode layer 22 is formed.

Then, an anode electrode 26 made of Ni and the like to be in ohmic contact with the anode layer 22 is formed at a predetermined location on a side of the surface of the anode layer 22. As a method of patterning the anode electrode 26 into a predetermined shape, a lift-off method of forming a metal film on a patterned resist mask by sputtering and the like, and then removing the resist mask and a portion of the metal film directly on the resist mask may be used, for example.

The PN diode according to Embodiment 1 as illustrated in FIG. 7 is thus obtained. In this example, the activation annealing process, the thermal oxide film formation process or the like is performed at a high temperature of 1000° C. or more, but it has been confirmed that none of the process devices is contaminated by Cr. It has also been confirmed that the leak current at application of the reverse voltage is smaller in the PN diode manufactured in this example than that in a PN diode manufactured on a commercially available substrate manufactured by sublimation.

Embodiments of the present invention can be modified or omitted as appropriate within the scope of the invention. While the invention has been described in detail, the foregoing description is in all aspects illustrative and does not restrict the present invention. It is understood that numerous modifications not having been exemplified can be devised without departing from the scope of the present invention

EXPLANATION OF REFERENCE SIGNS 10 silicon carbide substrate, 11 substrate inner portion, 12 substrate outer portion, 13 substrate surface region, 14 upper face, 15 lower face, 21 drift layer, 22 anode layer, 23 terminal region, 24 protective film, 25 cathode electrode, 26 anode electrode, 31 graphite crucible, 32 pure Si solvent

The invention claimed is:

1. A silicon carbide substrate comprising:
   a substrate inner portion; and
   a substrate outer portion surrounding the substrate inner portion, wherein
   a non-dopant metal impurity concentration of the substrate inner portion is $1\times10^{16}$ cm$^{-3}$ or more,
   a region of the substrate outer portion at least on a surface side thereof is a substrate surface region in which the non-dopant metal impurity concentration is less than $1\times10^{16}$ cm$^{-3}$, and
   the substrate outer portion surrounds the substrate inner portion on upper and lower faces or on side faces.

2. The silicon carbide substrate according to claim 1, wherein
   average threading screw dislocation density in the substrate surface region is 100 cm$^{-2}$ or less.

3. The silicon carbide substrate according to claim 1, wherein
the non-dopant metal impurity concentration has distribution in a thickness direction of the substrate inner portion or a direction perpendicular to the thickness direction.

4. The silicon carbide substrate according to claim 1, wherein
the non-dopant metal impurity concentration has distribution in a thickness direction of the substrate surface region or a direction perpendicular to the thickness direction.

5. The silicon carbide substrate according to claim 1, wherein
an impurity concentration of the substrate inner portion is set so that the substrate inner portion has a volume resistivity of 25 m Ωcm or less.

6. The silicon carbide substrate according to claim 1, wherein
an impurity concentration of the substrate outer portion is set so that the substrate outer portion has a volume resistivity of 25 m Ωcm or less.

7. The silicon carbide substrate according to claim 1, wherein
local threading screw dislocation density has distribution in the substrate surface region.

8. The silicon carbide substrate according to claim 1, wherein
the substrate outer portion surrounds the substrate inner portion on the upper and lower faces.

9. The silicon carbide substrate according to claim 8, wherein
the substrate outer portion also surrounds the substrate inner portion on the side faces.

10. The silicon carbide substrate according to claim 1, wherein
the substrate outer portion surrounds the substrate inner portion on the side faces.

* * * * *